United States Patent [19]

Seragnoli

[11] Patent Number: 5,523,632
[45] Date of Patent: Jun. 4, 1996

[54] METHOD AND DEVICE TO RECOVER ENERGY FROM DRIVING INDUCTIVE LOADS

[75] Inventor: Giordano Seragnoli, Milan, Italy

[73] Assignee: SGS-Thomson Microelectronics S.r.l., Milan, Italy

[21] Appl. No.: 127,816

[22] Filed: Sep. 28, 1993

[51] Int. Cl.⁶ ............................................. H01H 36/00
[52] U.S. Cl. ........................ 307/125; 361/159; 361/154; 361/155; 361/156; 333/222
[58] Field of Search .................... 307/125; 361/159, 361/154, 155, 156; 333/222

[56] References Cited

U.S. PATENT DOCUMENTS

| Re. 30,150 | 11/1979 | Puvogel | 361/152 |
| 4,835,655 | 5/1989 | Ricci et al. | 361/159 |
| 4,944,281 | 7/1990 | Suquet | 123/644 |

FOREIGN PATENT DOCUMENTS

| 2050738 | 1/1981 | United Kingdom | H03K 17/64 |
| 2095065 | 9/1982 | United Kingdom | H03K 17/04 |

OTHER PUBLICATIONS

Patent Abstracts of Japan, JP59220070; Nov. 12, 1984 Applicant: Toshiba KK; Inventor: Majima Shinichi "Switching Control Circuit".

*Primary Examiner*—William M. Shoop, Jr.
*Assistant Examiner*—Albert W. Paladini
*Attorney, Agent, or Firm*—David V. Carlson; Seed and Berry

[57] ABSTRACT

A circuit device for recovering energy from an inductive load is connected to a protection circuit for protecting a driver circuit from a charge contained in the inductive load. The inductive load is connected between a power supply line at one end and the driver circuit and protection circuit at another end. The circuit device has a charge accumulator, preferably a capacitor, connected to the protection circuit for accumulating charge from the inductive load. A control circuit monitors the level of charge in the capacitor. A switch, connected between the capacitor and the power supply line, permits the charge accumulated in the capacitor to discharge into the power supply line. The control circuit controls the switch so as to permit the intermittent discharge of the inductive load: the switch is opened to permit charge from the inductive load to accumulate in the capacitor; and, the switch is closed to permit the capacitor to discharge the accumulated charge to the power supply line.

20 Claims, 3 Drawing Sheets

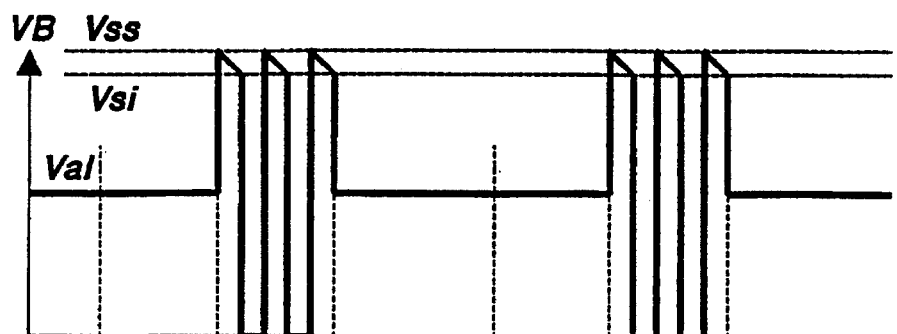
FIG. - 5
FIG. - 6
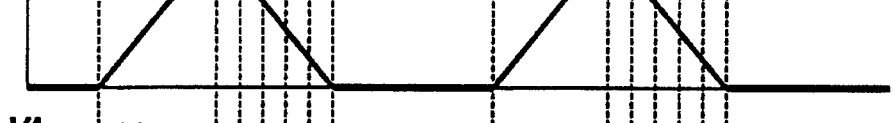
FIG. - 7
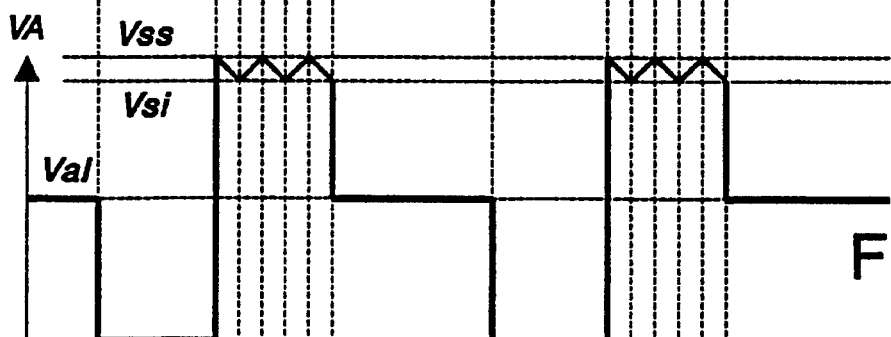
FIG. - 8
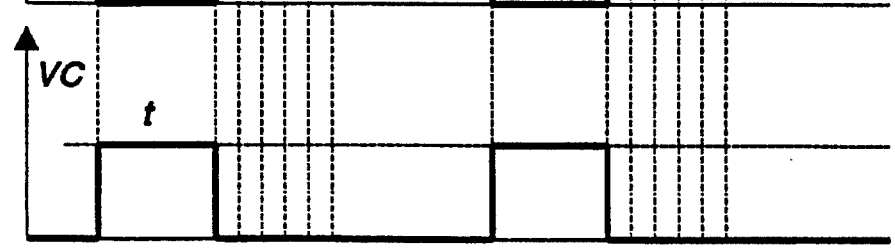

METHOD AND DEVICE TO RECOVER ENERGY FROM DRIVING INDUCTIVE LOADS

TECHNICAL FIELD

This invention relates to a circuit device for recovering energy from driving inductive loads, and also, to a method of turning off inductive loads in an energy-recovering way.

BACKGROUND OF THE INVENTION

As it is well known, during the "turn-off" transient of an inductive load, overvoltages are developed which may result in irreversibly damaging the load-driving electronic components.

To obviate such a serious drawback, the prior art has proposed driver circuits for inductive loads which incorporate protection arrangements against overvoltages.

A typical example of a circuit of this kind is illustrated by FIG. 1, where an inductive load represented by an inductance L is shown driven by a power transistor T between a power supply line at a voltage Val and ground.

When the power transistor is driven to conduct, as by means of an appropriate base voltage Vc(t), a voltage drop $V_L$ appears across the inductance L which is equal to the difference between the supply voltage Val and the collector-to-emitter voltage Vce of the transistor operating in the saturation phase. As a result, a current $I_L$ flows through the inductance, which is represented by the following relation:

$$I_L = (Val - Vce)/L.$$

Further, the amount of energy stored in the inductance will be:

$$(1/2) L I_L^2$$

Upon turning off, due to the natural inertia of the inductive load, the current $I_L$ tends to retain its value, and since under such conditions the transistor is in an open circuit state, the voltage at the collector rises to very high values, well above the supply voltage Val.

Accordingly, the transistor would be excited by an overvoltage which may cause it to fail.

To avoid such likely damage, a loop-back diode D has been proposed which is connected in parallel with the inductance. Upon turning off, the energy stored in the inductance is discharged as a current flowing through the diode D.

While being advantageous from certain aspects, this prior approach can only be adopted where switching speed is an unimportant limitation. The discharge time Ts offered by the prior approach actually is fairly long and often unacceptable for many practical applications, such as those for wire printers whose high printing rate requires very short current decay times.

To overcome this limitation, the prior art has proposed a second approach illustrated by FIG. 2 of the accompanying drawings.

A Zener diode Z is added and connected between the diode D and the power supply Val.

Upon turning off, the voltage across the inductance L is VF and VZ added together, the two last-mentioned terms representing the voltage drop across the diode D and the Zener diode Z.

The decay time, or time Ts to discharge the current $I_L$, is, therefore, reduced in accordance with the following relation:

$$Ts = L \, I_L/(VF+VZ)$$

By adjusting the threshold value VZ, the value of the discharge time Ts can be set for a given inductance L and current $I_L$. However, not even the latter prior approach is entirely devoid of disadvantages. For example, all of the energy stored in the inductance during the conduction period is lost to the Zener diode.

Dependent on the number and the characteristics of the inductive loads, the power lost to the Zener may be on the order of some tens of watts.

SUMMARY OF THE INVENTION

The underlying technical problem addressed by this invention is to provide a circuit device capable of rapid switching of inductive loads, while keeping the driving of such loads within safe limits, and overcoming the drawbacks mentioned hereinabove in connection with the prior art.

Another object of the invention is to regain, during the turn-off phase, the energy stored in the inductive load during the conduction phase.

The present invention uses the idea of transferring the stored energy from the inductance to a temporary "accumulator" and dumping it at regular intervals from the accumulator into the main power network.

The technical problems of prior approaches are solved by a circuit device as described in detail herein and defined in the claims.

The technical problem is also solved by a method of turning off inductive loads as described in detail herein and defined in the claims.

For example, a circuit device is disclosed for protecting a driver, the driver being configured to drive an inductive load. The circuit device of the present invention contains an accumulating device, preferably a capacitor, which builds up in the inductive load. A switch, preferably a field-effect transistor, is connected between the capacitor and the inductive load. A control circuit is coupled to the switch. The control means, also connected to the capacitor, monitors the level of charge in the capacitor. The inductor is connected to the capacitor and builds up a charge in the capacitor as the inductor discharges. When the voltage across the capacitor reaches a predetermined value, then the capacitor is connected to and allowed to discharge onto a voltage supply line. This process may be repeated several times.

BRIEF DESCRIPTION OF THE DRAWINGS

The features and advantages of a circuit device according to the invention, and associated turn-off method, will be apparent from studying the following detailed description of an embodiment thereof together with the accompanying drawings. The following description and figures are given by way of example and should not be construed to limit the scope of the invention.

In the drawings.

DETAILED DESCRIPTION OF THE PRESENTLY PREFERRED EXEMPLARY EMBODIMENT

Figure 1:
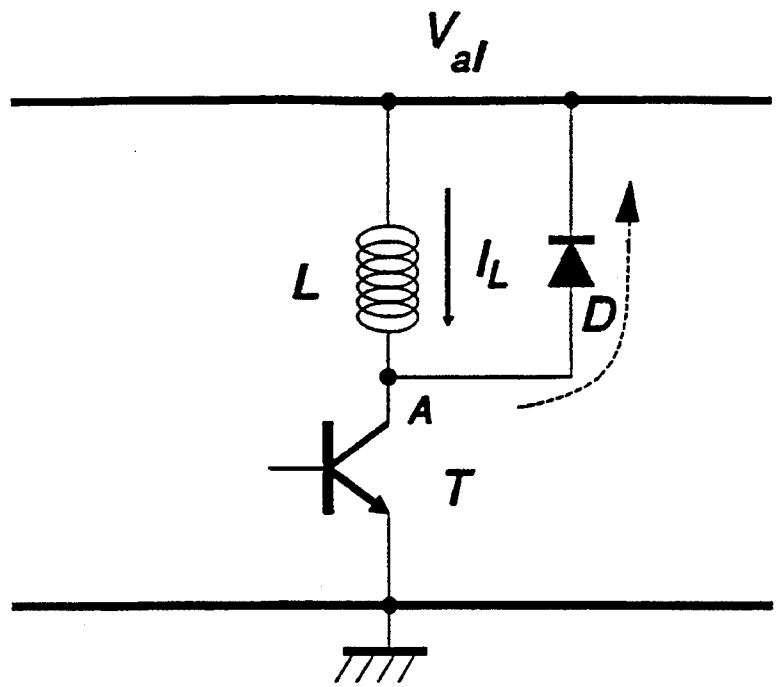
FIG. 1 shows diagrammatically a prior art turn-off circuit for an inductive load.
Figure 2:
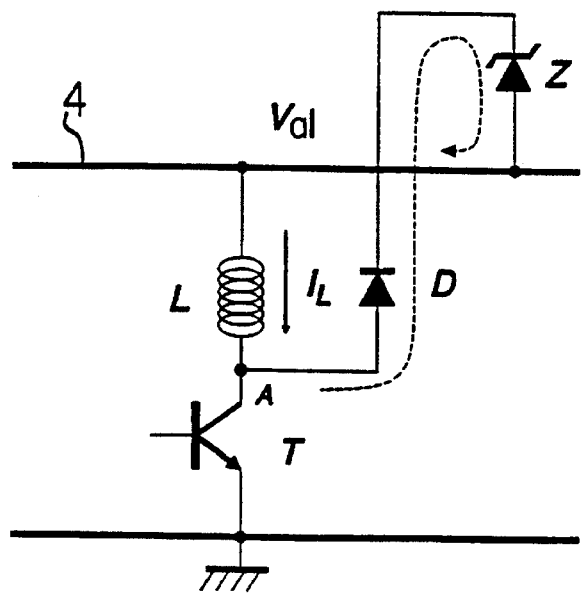
FIG. 2 shows a second embodiment of a prior art turn-off circuit.
Figure 3:
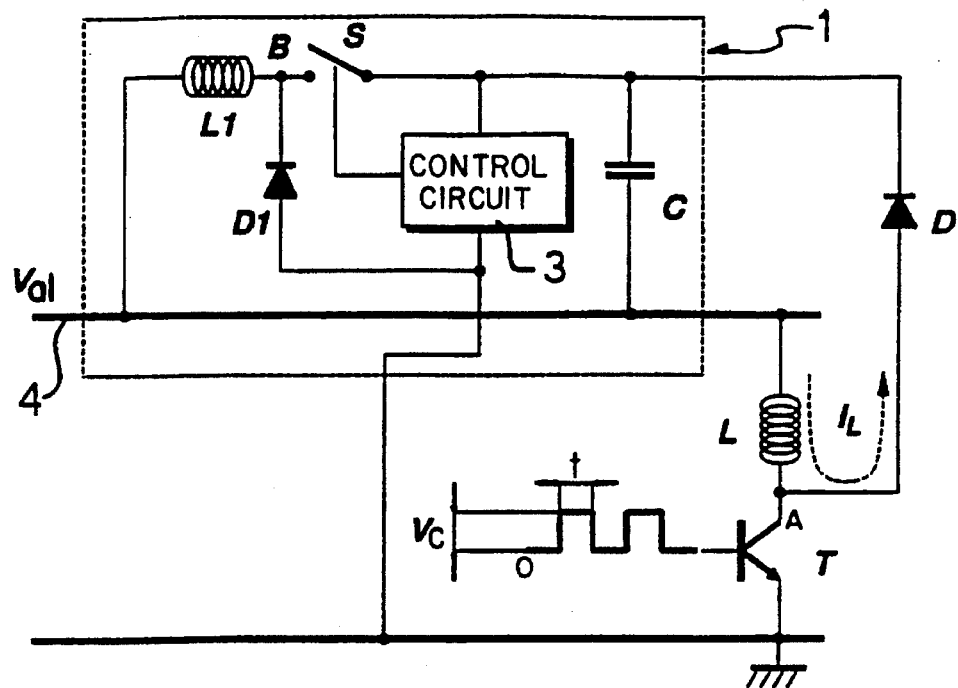
FIG. 3 shows diagrammatically a circuit device according to this invention.

Referring to FIG. 3, a circuit device 1 for recovering energy in driving an inductive load is shown.

Specifically, the device 1 is intended for association with a driver circuit 2. The driver circuit 2 drives inductance L.

The driver circuit 2 is quite simple in construction and comprises a power transistor T, preferably of the npn bipolar type. This transistor T has its collector terminal A connected to one end of the inductance L.

The other end of the inductance L is connected to a line 4 over which a voltage Val is supplied.

Further, the transistor T has its emitter terminal E connected to ground and its base adapted to receive a time-variable voltage control signal; hereinafter, this signal will be designated Vc(t), its waveform being as shown in FIG. 8.

The device 1 comprises a capacitor C which functions as an electric charge accumulator during the inductance L turn-off phase.

The capacitor C is connected in the circuit device 1 with one end run to the Val supply line 4.

Connected between the circuit device 1 and the driver circuit 2 is a loop-back diode D. More particularly, the diode D is connected with one end to the collector A of the transistor T, and with its other end to the other end of the capacitor C.

Also provided is a control circuit 3 which monitors the voltage drop V across the capacitor C.

The control circuit 3 is connected between one end of the capacitor C and ground.

The control circuit 3 comprises a hysteresis voltage comparator IC1 whose hysteresis is appropriate to switch between two predetermined threshold levels: a voltage Vss (upper threshold) and a voltage Vsi (lower threshold). Preferably, the value of Vss is selected to be twice that of the voltage supply Val.

Linked operatively to the control circuit 3 is a normally open microswitch S connected at one end to the diode D. This same end of the microswitch 5 is connected to the supply line 4, through the capacitor C. In addition, an inductor L1 is provided between a fixed contact B of the switch S and the Val supply line 4.

The construction of the circuit device 1 is completed by a protection diode D1 which is connected between the fixed contact B and ground.

In this embodiment, a field-effect transistor T1 serves the function of the microswitch S.

The drain terminal P1 of said transistor T1 is connected to the capacitor C, whilst the source terminal. S1 of transistor T1 is connected to the inductor L1.

The control circuit 3 preferably comprises an operational amplifier IC1 operating as a hysteresis voltage comparator. Operational amplifiers operating as hysteresis voltage comparators are well known. Those skilled in the art may select from any such amplifiers and use currently available designs which are suitable for use in the present invention. Additionally, any compatible circuit operating as a hysteresis voltage comparator, as described more fully below, may be used. The control circuit 3 also comprises a Zener diode Z at which a voltage VZ appears.

The inverting input of the comparator IC1 is held at a reference voltage value Vref. The non-inverting input is connected to ground through a resistor R1. The non-inverting input is also connected to the capacitor C through the Zener diode Z.

The comparator IC1 has a hysteresis voltage Vi which straddles the value of the reference voltage Vref. The comparator IC1 will change its state upon the voltage at the non-inverting input attaining respectively the following values:

$$Vss=Vref+Vi/2 \text{ or } Vsi=Vref-Vi/2.$$

The comparator IC1 has an output connected to a base terminal B2 of an npn bipolar transistor T2 having its emitter E2 connected to ground. A resistor R2 is connected between the output of the comparator IC1 and the base B2.

A collector C2 of this transistor T2 is coupled to a gate terminal G1 of transistor T1 through a transformer TR1.

It is understood that the scope of this invention encompasses any other coupling arrangements which can enable the gate G1 to be driven from the output of the comparator IC1.

Figure 4:
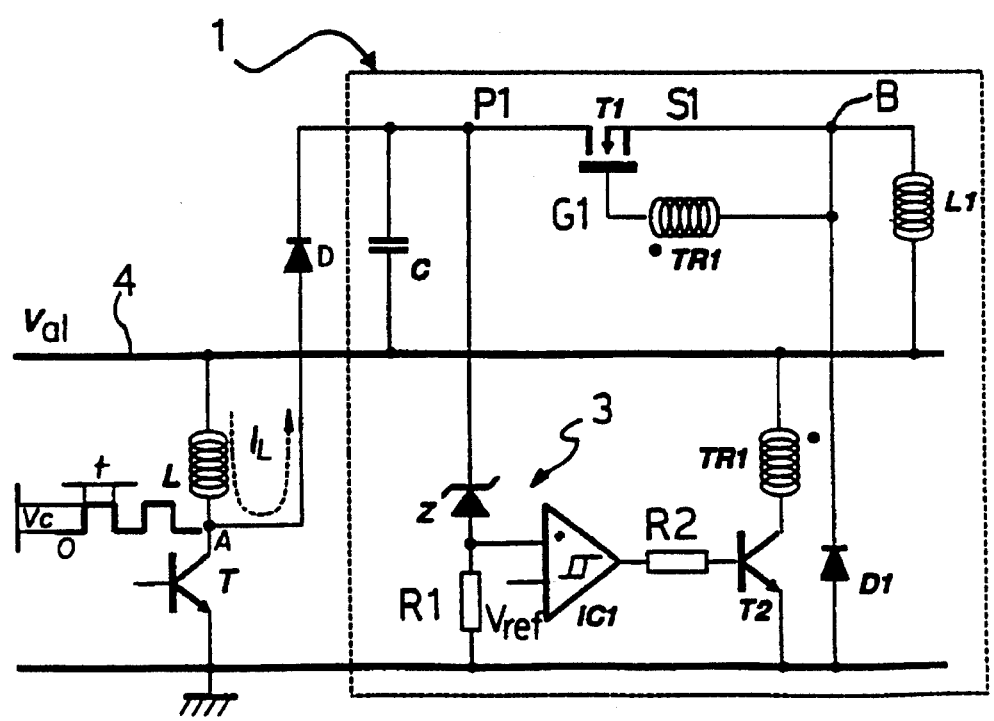
FIG. 4 is a diagrammatic view showing the device of FIG. 3 in greater detail; and, FIGS. 5 to 8 are respective diagrams of signal waveforms present in the circuit device of this invention.

Referring to FIG. 4, the operation of the circuit device according to the invention and the method for turning off the inductance L will now be described.

Upon the transistor T being turned off, due to a base-to-emitter voltage drop Vc(t)=0, the current $I_L$ at the inductance L will tend to retain its initial value by inertia.

Through the diode D, which has the voltage drop VF present across it, the current $I_L$ begins to charge the capacitor C in the device 1.

Across the capacitor C, the voltage V is VA-VF, where VA is the collector voltage of the power transistor T.

This voltage value V is constantly monitored by the control circuit 3.

When the voltage V at the capacitor C attains the upper voltage threshold value Vss, the control circuit 3 will close the switch S. In this way, the capacitor C is allowed to discharge to the main supply line 4 through the inductor L1.

On the other hand, as the capacitor C attains the lower threshold value Vsi, the switch S is opened by control circuit 3, and the capacitor is charged again by the current $I_L$ until the voltage across it rises back to the upper threshold voltage Vss.

More specifically, when the voltage of the capacitor C compared to ground reaches the value of $$Vss=VZ+Vref+Vi/2,$$

the comparator IC1 controls the bipolar transistor T2 to conduct, which in turn places the field-effect transistor T1 in conduction via the transformer TR1.

Conversely, as the voltage at the capacitor C reaches the value of $$Vsi=VZ+Vref-Vi/2,$$

the comparator state is changed over to turn off transistor T2 and switch transistor T1 to an open circuit state. Thus, the capacitor C can be charged by the current $I_L$ back to the voltage Vss, and this cycle is repeated as shown in FIG. 6 until the current $I_L$ is fully depleted.

The capacitor voltage V has, during the depletion phase of the current $I_L$, a ripple lying between the threshold values Vss and Vsi, as shown in FIG. 5. The peak-to-peak width is equal to the value of the hysteresis voltage Vi.

The value of the inductor L1 is much lower than the inductance L. Consequently, the discharge current of the capacitor C will be much higher than the charge current $I_L$. This results in a much shorter time during which the switch S is held closed than the full discharge time of the inductance L.

Stated otherwise, for each discharge cycle of the inductance L, there will occur several discharge cycles of the capacitor C. For simplicity of illustration, FIGS. 5 and 8 only show three open and close cycles of the switch S. The switching rate of the comparator IC1 is dependent on the values of the current $I_L$, the capacitor C, the hysteresis Vi, and the small inductor L1.

Advantageously, the circuit device of this invention is self-adaptive in that, for different values of $I_L$, the switching rate changes automatically to hold the upper threshold voltage Vss at a predetermined constant value. This value of Vss would be selected to suit the characteristics of the inductive load, the maximum value to be assigned to the collector voltage VA of the power transistor T, and the target decay time for the current $I_L$. The voltage VA pattern is shown in FIG. 7.

FIG. 5 is a plot of the voltage at node B of FIG. 4 versus time t. As shown, during the charging interval of the inductive load L, and during the interval beginning when the load L is completely discharged and ending at the beginning of the next charge cycle, the voltage VB is substantially equal to the power supply voltage Val. This is because during these intervals, no current is flowing through the inductor L1, which is coupled between the power supply voltage Val and the node B. During the portions of the discharging interval of the inductive load L when T1 is closed, the voltage VB follows the voltage at the node P1. That is, when T1 is closed, VB starts out at Vss and decreases linearly to the lower threshold voltage Vsi. At this point, the circuit 3 turns off the discharge transistor T1. The inductance L1, however, resists the turning off of T1 by continuing to discharge stored current into the power supply via the diode D1. Thus, during the discharging interval when T1 is open, D1 maintains the voltage VB at one diode drop below ground. When the voltage at node P1 again attains Vss, the cycle begins anew. The cycle repeats until the inductive load L is discharged.

FIG. 6 is a plot of the current $I_L$ through the inductive load L versus time. As shown, during the charging interval, the current $I_L$ increases linearly to a maximum value at a time that is concurrent with both the end of the charging interval and the beginning of the discharge interval. During the discharging interval of the inductive load L, the current $I_L$ decreases to a minimum value, here zero, in a linear fashion.

FIG. 7 is a plot of the voltage VA at node A of FIG. 4 versus time. During the charging interval of the inductive load L, the voltage VA is equal to the voltage drop across the transistor 2 of Vcc, which is approximately 0 or ground. During the discharging interval, the voltage at node A is approximately one diode drop above the voltage at the node P1. For clarity, however, FIG. 7 omits this diode drop. Thus, VA is shown as oscillating between the high threshold Vss and the low threshold Vsi for the total discharging period. After the discharge of the inductive load L, but before the next charging interval, there is no current flowing through either the inductive load L or the transistor T. Therefore, VA is equal to the power supply voltage Val.

FIG. 8 is a plot of the voltage Vc, which drives the transistor T, versus time. During the charging interval, Vc, which is a square wave that has a duty cycle that is less than 50%, is at a voltage level sufficient to drive the transistor T into saturation. During and after the discharging interval, but before the next charging interval, the signal Vc has a level of approximately 0 volts or ground. Although shown having a duty cycle of less than 50%, the signal Vc may have other duty cycles without departing from the spirit and scope of the invention. It is preferable, however, that the duty cycle be such to give the inductive load L sufficient time to completely discharge.

The circuit device of this invention does solve the technical problem and affords a number of advantages, foremost among which is the ability to maintain a high voltage across the inductance during the discharge period of the loop-back current. In addition, when the inductive load is repeatedly turned off, the overvoltages are held within predetermined small values.

The energy stored in the inductance during conduction is nearly all regained and returned to the power supply network, thereby bringing about considerable savings in overall energy consumption and avoiding the risk of overheating due to power dissipation.

Understandably, many changes and modifications may be made unto the device of this invention without departing from the invention's scope as defined in the appended claims.

In particular, other circuit arrangements could be adopted within the frame of this principle of recovering the inductance discharge energy.

I claim:

1. A circuit device for recovering energy in inductive load driving, being of a type associated with a driver circuit for the inductive load which is connected to a power supply line, characterized in that it comprises:

a charge accumulator connected to one end of the inductive load;

a control circuit for monitoring the charge level of said accumulator;

a switch controlled by said control circuit and connecting said accumulator to said power supply line; and said control circuit operable to intermittently discharge said charge accumulator while the inductive load is discharging.

2. A circuit device according to claim 1, characterized in that said charge accumulator is a capacitor.

3. A circuit device according to claim 1, characterized in that an inductor is connected between said switch and said line.

4. A circuit device according to claim 1, characterized in that said control circuit includes a hysteresis voltage comparator.

5. A circuit device according to claim 1, characterized in that said switch is a transistor T1.

6. A circuit device according to claim 2, characterized in that the driver circuit for the inductive load is connected to one end of said capacitor through a current loop-back diode D.

7. A circuit device according to claim 4, characterized in that said switch is linked operatively to the output of said hysteresis comparator.

8. A circuit device according to claim 7, characterized in that an inductive coupling with a transformer TR1 is arranged between the output of said comparator and said switch.

9. A method of turning off inductive loads in an energy-recovering way, characterized in that charges from the energy stored in an inductive load are transferred during a charge transfer period to a charge accumulator and said charge accumulator is discharged to a power supply line during said charge transfer period.

10. A method according to claim 9, characterized in that the accumulator charge and discharge cycles are regulated by an electronic control means effective to monitor the charge level and switch the connection to the power line.

11. In a system containing a driving circuit for driving an inductive load and a protection circuit for protecting the driving circuit from a charge contained in the inductive load, the inductive load being coupled between the driving circuit and a supply line, and the protection circuit coupled between the inductive load and the driving circuit, a circuit device for recovering energy from the inductive load comprising:

- accumulating means for accumulating the charge from the inductive load;
- switch means coupled between the accumulating means and the supply line for switchably coupling the accumulating means and the supply line; and,
- control means electrically coupled to the accumulating means and the switch means for monitoring a level of charge in the accumulating means and for controlling the switch means, so that when the level of charge reaches a first level, the control means permits the switch means to electrically couple the accumulating means and the supply line, thereby returning the charge to the supply line.

12. A system according to claim 11 wherein the switch means is a field-effect transistor.

13. A system according to claim 11 wherein the accumulator means is a capacitor.

14. A system according to claim 11 wherein the control means comprises a comparator coupled to the accumulating means, and an enabling means coupled between the comparator and the switch means.

15. A system according to claim 14 wherein the enabling means comprises a transistor having its base coupled to the comparator, and a transformer coupled between a collector of the transistor and the switch means.

16. A system according to claim 11 further comprising an inductor electrically coupled between the switch means and the supply line.

17. A system according to claim 16 further comprising a diode, connected at a first end between the switch means and the inductor, and at a second end to a ground.

18. A system according to claim 11 wherein the protection circuit is a diode.

19. In a system containing a driving circuit for driving an inductive load and a protection circuit for protecting the driving circuit from a charge contained in the inductive load, a method for recovering energy from the inductive load comprising the steps of:

- accumulating charge from the inductive load;
- monitoring a level of charge accumulated; and,
- controllably discharging the accumulated charge when the monitored level of accumulated charge reaches a predetermined level.

20. A method according to claim 19 wherein the steps of accumulating, monitoring, and controllably discharging are repeated until the charge contained in the inductive load is substantially depleted.

\* \* \* \* \*

UNITED STATES PATENT AND TRADEMARK OFFICE
CERTIFICATE OF CORRECTION

PATENT NO.    : 5,523,632
DATED         : June 4, 1996
INVENTOR(S)   : Giordano Seragnoli It is certified that error appears in the above identified patent and that said Letters Patent is hereby corrected as shown below:

In column 6, line 58, following "transistor", please delete "T1".

In column 6, line 62, please delete "D".

In column 6, line 67, following "transformer", please delete "TR1".

Signed and Sealed this

Twenty-second Day of October, 1996

*Attest:*

BRUCE LEHMAN

*Attesting Officer*     *Commissioner of Patents and Trademarks*